(12) United States Patent
Friedrich

(10) Patent No.: US 7,089,469 B2
(45) Date of Patent: Aug. 8, 2006

(54) ELECTRICAL CIRCUIT UNIT AND A METHOD FOR TESTING THE ELECTRICAL CIRCUIT UNIT VIA AN ELECTRICAL TEST INTERFACE

(75) Inventor: Carsten Friedrich, Ludwigsburg (DE)

(73) Assignee: Alcatel, Paris (FR)

( * ) Notice: Subject to any disclaimer, the term of this patent is extended or adjusted under 35 U.S.C. 154(b) by 401 days.

(21) Appl. No.: 10/237,803

(22) Filed: Sep. 10, 2002

(65) Prior Publication Data

US 2003/0057992 A1    Mar. 27, 2003

(30) Foreign Application Priority Data

Sep. 12, 2001    (EP)    ................................. 01440297

(51) Int. Cl.
*G01R 31/28*    (2006.01)
(52) U.S. Cl. ..................................... 714/726
(58) Field of Classification Search ................ 714/724, 714/726, 727, 729, 731, 733; 324/763, 765
See application file for complete search history.

(56) References Cited

U.S. PATENT DOCUMENTS 5,781,485 A * 7/1998 Lee et al. .................... 365/201
6,255,838 B1   7/2001 Habersetzer et al.
6,446,230 B1 * 9/2002 Chung ........................ 714/726

FOREIGN PATENT DOCUMENTS

EP    0978726 A2    2/2000

* cited by examiner

*Primary Examiner*—Albert Decady
*Assistant Examiner*—James C. Kerveros
(74) *Attorney, Agent, or Firm*—Sughrue Mion, PLLC

(57) ABSTRACT

The invention relates to a method for testing and commissioning an electrical circuit unit (integrated circuit, module, device), and the electrical circuit unit. Test signals are exchanged, via an electrical test interface between the environment of the circuit unit and a test circuit unit contained in the circuit unit. Tests are carried out by the test circuit unit within the circuit unit. The tests are initiated externally by test signals and the results of the tests are transmitted externally via test signals. At the end of the tests, a reconfiguration of the test circuit unit is carried out in such a way that the circuit parts initially required for the test circuit unit undertake normal operating tasks of the circuit unit after the subsequent commissioning.

8 Claims, 1 Drawing Sheet

ELECTRICAL CIRCUIT UNIT AND A METHOD FOR TESTING THE ELECTRICAL CIRCUIT UNIT VIA AN ELECTRICAL TEST INTERFACE

BACKGROUND OF THE INVENTION

The invention is based on a priority application EP 01 440 297.8 which is hereby incorporated by reference.

The present invention relates to a method for the testing and commissioning of an electrical circuit unit (integrated circuit, module, device), in which method test signals are exchanged, via an electrical test interface provided for the purposes, between the environment of the circuit unit and a test circuit unit contained in the said circuit unit, in which method tests are carried out by the test circuit unit within the circuit unit, the said tests being initiated externally by test signals and the results of the tests being transmitted externally via test signals, an electrical circuit unit (integrated circuit, module, device) with a test circuit unit contained in the circuit unit and an electrical test interface that is designed so that, via the latter, test signals can be exchanged between the environment of the circuit unit and the test circuit unit contained in the circuit unit, in which circuit unit the test circuit unit is designed so that, by means of the latter, tests can be carried out within the circuit unit, the said tests being able to be initiated externally by test signals and the results of the tests being able to be transmitted externally via test signals, and an electrical circuit unit (integrated circuit, module, device) that is designed at least partially as an electrically reconfigurable circuit.

The fact that a newly manufactured circuit can also be checked (tested) before it is commissioned or used may be regarded as obvious. It has also been known for a long time that the tests are automated in industrial production. Apart from test pins (probes), by means of which test signals can be applied or test results can be tapped, the use of integrated test circuits has also been known for a long time. The term "integrated" is in this context not understood to denote a specific technology, but rather that such an integrated test circuit is an integral component of the respective circuit and is manufactured in conjunction with the latter and also remains connected to the latter after the tests.

The above comments apply irrespective of whether the "circuit" is now an integrated circuit in the contemporary stricter sense, or is a module with possibly several integrated circuits or even a larger device that in turn possibly consists of several modules. All this is intended to be included in the generic term "electrical circuit unit" used here. Also, the test circuit, like the circuit unit itself, is depending on the circumstances constructed in a hierarchical manner and may in the case of a relatively large device altogether comprise a complete test module, an integrated circuit as test circuit in each individual module, and a "test corner" in each individual integrated circuit. Suitable signal pathways are then necessarily also present on the one hand between these test circuits and on the other hand starting from these test circuits and passing through the circuit parts to be tested and back again to the test circuits. It is also necessarily possible to initiate the tests externally by test signals and also to transmit the results externally via test signals. To cover such complex arrangements there is an IEEE Norm, namely IEEE 1149.1, "IEEE Standard Test Access Port and Boundary Scan Architecture", as well as subsidiary norms for more detailed specific application cases.

It is of course in principle also possible to carry out such tests subsequently from time to time during operation, via such integrated test circuits. As a rule though this facility is not provided since these test circuits constitute an unnecessary ballast that merely takes up space and, since they cannot be completely disconnected, possibly even consume unnecessary energy and produce corresponding heat.

SUMMARY OF THE INVENTION

The object of the invention is to provide a possibility of on the one hand being able to carry out the necessary tests at the start, and on the other hand not having constantly to include the ballast of a test circuit.

This object is achieved in accordance with the present invention by a method for the testing and commissioning of an electrical circuit unit (integrated circuit, module, device), in which method test signals are exchanged, via an electrical test interface provided for the purposes, between the environment of the circuit unit and a test circuit unit contained in the said circuit unit, in which method tests are carried out by the test circuit unit within the circuit unit, the said tests being initiated externally by test signals and the results of the tests being transmitted externally via test signals, carrying out at the end of the tests a reconfiguration of the test circuit unit in such a way that the circuit parts initially required for the test circuit unit undertake normal operating tasks of the circuit unit after the subsequent commissioning. This object is further achieved in accordance with the present invention by an electrical circuit unit (integrated circuit, module, device) with a test circuit unit contained in the circuit unit and an electrical test interface that is designed so that, via the latter, test signals can be exchanged between the environment of the circuit unit and the test circuit unit contained in the circuit unit, in which circuit unit the test circuit unit is designed so that, by means of the latter, tests can be carried out within the circuit unit, the said tests being able to be initiated externally by test signals and the results of the tests being able to be transmitted externally via test signals, the test circuit unit being designed as an electrically reconfigurable circuit and the circuit unit being designed so that, at the end of the tests, a reconfiguration of the test circuit unit is possible in such a way that the circuit parts initially provided as test circuit unit can undertake normal operating tasks of the circuit unit after the subsequent commissioning. This object is further achieved in accordance with the present invention by an electrical circuit unit (integrated circuit, module, device) that is designed at least partially as an electrically reconfigurable circuit, the circuit unit being so designed, and at least a part of the circuit parts designed as an electrically reconfigurable circuit may be configured in such a way that, from the at least one part of the circuit parts designed as an electrically reconfigurable circuit, it is possible to provide connections to an interface with the environment of the circuit unit, as well as test loops within the circuit unit.

The basic concept of the invention is to design at least one part of a circuit unit in a reconfigurable manner and to use this part first of all as a test circuit and subsequently, after reconfiguration, together with the rest of the circuit unit for its normal operation.

Further modifications of the invention are disclosed in the subclaims and in the following description.

BRIEF DESCRIPTION OF THE DRAWINGS

The invention will be described in more detail hereinafter with the aid of the accompanying drawings.

The only FIGURE shows an embodiment of a circuit unit according to the invention in which the method according to the invention may be carried out.

DETAILED DESCRIPTION

Figure 1:
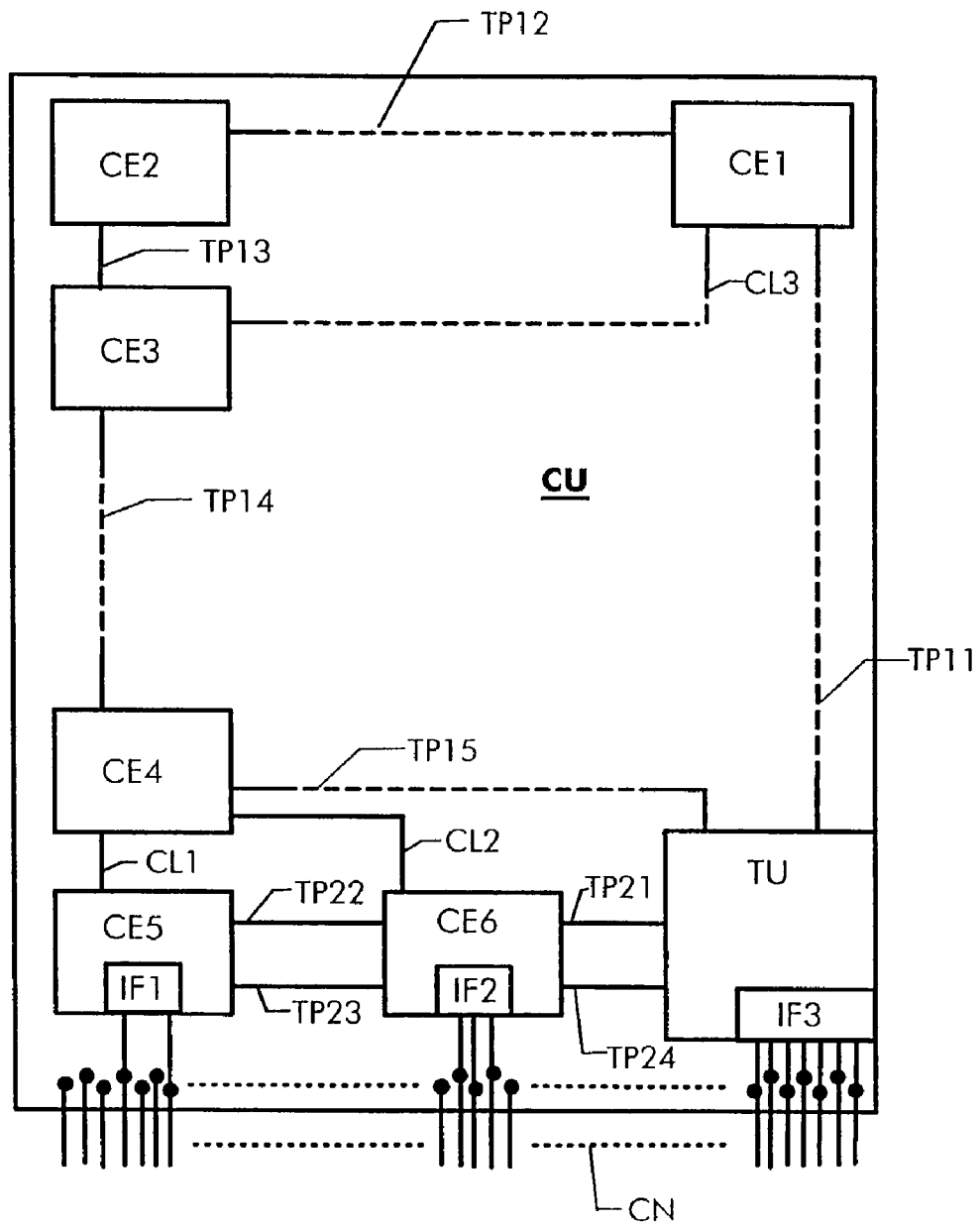

An example of the construction of a circuit unit according to the invention is first of all described with the aid of the figure.

The figure shows a circuit unit CU in the form of a plug-in printed circuit board. The circuit unit comprises a plurality of individual circuit elements, designated as the circuit elements CE1, . . . , CE6. A test circuit unit TU is also identified. Interface circuits IF1, IF2 and IF3 are shown in the circuit elements CE5 and CE6 and in the test circuit unit TU. An edge connector CN is also represented at the lower edge of the circuit board by its individual plug pins. Individual connections between the interface circuits IF1, IF2 and IF3 on the one hand and individual plug pins of the edge connector CN on the other hand are also shown. Within the circuit unit CU two test pathways TP1 and TP2 are shown starting from the test circuit unit TU and returning to the latter through the test pathway sections TP11, . . . , TP15 and TP21, . . . , TP24. Furthermore three connection leads CL1, CL2 and CL3 are shown by way of example as connections between pairs of circuit elements, more specifically the circuit element pairs CE4–CE5, CE4–CE6 and GE1–GE3.

Such a printed circuit board may be regarded as a module of a larger circuit. By means of another diagrammatic representation (omission of the edge and edge connector) and different naming of the parts (circuit element as printed circuit board) a complete device will, through a different interpretation, thereby become an integrated circuit in the stricter sense.

If in the FIGURE the test circuit unit TU is similarly designated as a circuit element and if the test pathway sections TP11, . . . , TP15 and TP21, . . . , TP24 are designated as connection leads, then a further embodiment of the invention is likewise obtained. The embodiment according to the figure and the latter embodiment represent the two variants of one and the same circuit unit, as are obtained before and after the reconfiguration of the initial test circuit unit.

In the circuit unit CU according to the figure a test configuration is provided with (in this case two) test loops, as is envisaged for example in the Norm mentioned in the introduction. The test loops starting from the test circuit unit TU and forming a closed circuit, in this ease the test pathways TP1 and TP2 and any possible further undesignated test loops, connect all circuit elements to be tested to the test circuit unit TU. From the latter various tests can then be initiated in the individual circuit elements and the results of these tests can be transmitted back to the test circuit unit TU. These tests may be initiated or controlled externally via the interface IF3; the results may be transmitted externally via this interface.

A test configuration that also commonly occurs envisages generating a test signal in a test generator and feeding this test signal at a suitable point to a signal pathway instead of a signal subsequently occurring during operation, and decoupling the resulting signal at another point of the signal pathway and returning it to a test receiver. The test circuit unit TU could also substantially consist of at least one such test generator and at least one test receiver. The test pathways would then largely coincide with the signal pathways of the normal operation.

The test circuit unit TU is in fact designed so that it can be reconfigured externally, in this case via the interface IF3, after completion of the tests, and possibly subsequently several times more. The reconfiguration may of course also take place via other pathways, for example via an additional interface that is integrated in the test circuit unit TU, possibly together with the already existing interface IF3.

This is possible for example if the test circuit unit TU is designed as a so-called "FPGA" (Field Programmable Gate Array). Such FPGAs are generally known per se, and comprise a plurality of logic gates whose connections with one another may be programmed. A concrete logic arrangement is thereby constructed overall.

Another possible way of reconfiguring the test circuit unit TU is if the latter comprises inter alia a microprocessor and a program memory and the program memory first of all contains a program by means of which the microprocessor tests the circuit unit CU. A program can then be written into the program memory via the interface IF3, by means of which the subsequent operation of the circuit unit CU is then carried out.

That part of the circuit unit CU that is formed only by reconfiguration of the test circuit unit TU after the tests may of course not be included in the tests before the reconfiguration. At least the components of the test circuit unit TU such as memories, processors and logic gates remain unchanged however in the reconfiguration and may thus be tested. Only the connections of the components with one another as well as the contents of the memories are changed and may therefore possibly be defective. As regards the contents of the memories, there should be no problem in reading these for checking purposes. With regard to the reconfiguration of the connections between gates, this could conceivably be carried out stepwise in such a way that the already reconfigured circuit parts are tested as regards their new function by the still non-reconfigured circuit parts.

Obviously when designing the overall circuit it must be borne in mind that those connection parts that are first of all required as test pathway sections, as well as the associated outputs and inputs of the circuit elements, also remain unaltered after the reconfiguration. This may be achieved for example if, as test pathway sections, those connections leads are used that are in any case necessary in the subsequent operation. Another possibility is to arrange the individual circuit elements so that they can be switched to various operating modes, one operating mode then being the test operation.

Nowadays it is not unusual for example for rapid data or signal connections not to employ electrical conductors but instead glass fibres, infrared or radio connections. It is entirely possible for the present invention also to be used for such circuit units, in which at least some connection leads or test pathway sections are designed in such a different way. This is all the more so if the interface circuits operate with such different types of connections.

The invention claimed is:

1. A method for testing and commissioning an electrical circuit unit, comprising:
   exchanging test signals via an electrical test interface between environment of the circuit unit and a test circuit unit contained in said circuit unit;
   carrying out tests by the test circuit unit within the circuit unit, wherein the tests are initiated externally by test signals and the results of the tests are transmitted externally via test signals; and subsequent to the end of testing, electrically reconfiguring at least one internal circuit path of the test circuit unit to allow circuit parts initially part of the test circuit unit to undertake normal operating tasks of the circuit unit subsequent to commissioning.

2. The method of claim 1, wherein the reconfiguration takes place via the test interface.

3. The method of claim 1, wherein the reconfiguration of the circuit parts takes place stepwise to allow the already reconfigured circuit parts to be tested as regards their new function by still non-reconfigured circuit parts.

4. An electrical circuit unit comprising a test circuit unit contained in the circuit unit and an electrical test interface, wherein test signals can be exchanged via the electrical test interface between environment of the circuit unit and the test circuit unit contained in the circuit unit;

wherein tests can be carried out within the circuit unit by the test circuit unit;

wherein said tests are able to be initiated externally by test signals and results of the tests are able to be transmitted externally via test signals; and wherein the test circuit unit is an electrically reconfigurable circuit and, at the end of the tests, at least one internal circuit path of the test circuit unit is electrically reconfigured so circuit parts initially part of the test circuit unit can undertake normal operating tasks of the circuit unit subsequent to commissioning.

5. An electrical circuit unit comprising an electrically reconfigurable circuit, wherein at least a part of circuit parts comprising the electrically reconfigurable circuit can be temporarily coupled to the circuit unit and to test loops within the circuit unit, and wherein at least one internal circuit path within the electrically reconfigurable circuit can be electrically reconfigured so at least a part of the circuit parts can be configured to work as a test circuit unit or to undertake normal operating tasks of the electrical circuit unit.

6. The electrical circuit unit of claim 4, wherein the reconfiguration takes place via the test interface.

7. The electrical circuit unit of claim 4, wherein the reconfiguration of the circuit parts takes place stepwise to allow the already reconfigured circuit parts to be tested as regards their new function by still non-reconfigured circuit parts.

8. The electrical circuit unit of claim 4, wherein the test circuit unit comprises a microprocessor and a program memory.

* * * * *